(12) United States Patent
Kogure et al.

(10) Patent No.: US 12,431,785 B2
(45) Date of Patent: Sep. 30, 2025

(54) TRACKER MODULE

(71) Applicant: Murata Manufacturing Co., Ltd., Nagaokakyo (JP)

(72) Inventors: Takeshi Kogure, Nagaokakyo (JP); Tomohide Aramata, Nagaokakyo (JP); Toshiki Matsui, Nagaokakyo (JP); Yuuki Fukuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 26 days.

(21) Appl. No.: 18/615,010

(22) Filed: Mar. 25, 2024

(65) Prior Publication Data

US 2024/0235364 A1    Jul. 11, 2024

Related U.S. Application Data

(63) Continuation of application No. PCT/JP2022/035990, filed on Sep. 27, 2022.

(30) Foreign Application Priority Data

Sep. 29, 2021   (JP) .................................. 2021-159934

(51) Int. Cl.
*H02M 1/00*    (2007.01)
*H02M 3/07*    (2006.01)

(52) U.S. Cl.
CPC ........... *H02M 1/0048* (2021.05); *H02M 3/07* (2013.01)

(58) Field of Classification Search
CPC .................................................. H02M 1/0048
USPC ....................................................... 327/540
See application file for complete search history.

(56) References Cited

U.S. PATENT DOCUMENTS

| 8,824,978 | B2 | 9/2014 | Briffa et al. |
| 9,669,621 | B2 | 6/2017 | Nozawa |
| 9,755,672 | B2 | 9/2017 | Perreault et al. |
| 9,937,712 | B2 | 4/2018 | Nozawa |
| 2014/0118063 | A1 | 5/2014 | Briffa et al. |
| 2015/0155895 | A1 | 6/2015 | Perreault et al. |

(Continued)

FOREIGN PATENT DOCUMENTS

| JP | 2015-533066 A | 11/2015 |
| JP | 2017-043007 A | 3/2017 |

OTHER PUBLICATIONS

International Search Report received for PCT Patent Application No. PCT/JP2022/035990, mailed on Dec. 20, 2022, 2 pages.

*Primary Examiner* — Tomi Skibinski
(74) *Attorney, Agent, or Firm* — ArentFox Schiff LLP

(57) ABSTRACT

A tracker module includes an integrated circuit, a first capacitor and a second capacitor arranged in or on a module laminate. The integrated circuit includes at least one switch in a switched-capacitor circuit and at least one switch in a supply modulator. The switched-capacitor circuit is configured to generate a plurality of discrete voltages. The supply modulator is configured to generate an output voltage by selectively switching among the plurality of discrete voltages based on a control signal. The first capacitor is a flying capacitor of the switched-capacitor circuit. The second capacitor is a smoothing capacitor of the switched-capacitor circuit. In a plan view of the module laminate, the first capacitor is arranged closer to the integrated circuit than the capacitor.

20 Claims, 8 Drawing Sheets

(56) References Cited

U.S. PATENT DOCUMENTS

2017/0057221 A1* 3/2017 Nozawa ................ B41J 2/0455
2017/0239942 A1 8/2017 Nozawa

* cited by examiner

TRACKER MODULE

CROSS REFERENCE TO RELATED APPLICATIONS

This application is a continuation of International Application No. PCT/JP2022/035990, filed Sep. 27, 2022, which claims priority to Japanese Patent Application No. 2021-159934, filed Sep. 29, 2021, the entire contents of each of which are hereby incorporated by reference in their entirety.

TECHNICAL FIELD

The present disclosure relates to a tracker module.

BACKGROUND

An example circuit, such as that disclosed in U.S. Pat. No. 9,755,672 (hereinafter "Patent Document 1"), includes a power modulation circuit capable of supplying a power amplifier with a power supply voltage that is dynamically adjusted over time in accordance with a radio frequency signal.

In the modularization of the power modulation circuit of the example circuit of Patent Document 1, the output characteristics of the power modulation circuit (e.g., a power supply circuit) may deteriorate due to resistance losses in the wiring lines of a switched-capacitor circuit.

SUMMARY OF THE INVENTION

Accordingly, the present disclosure provides a tracker module that reduces resistance losses due to the wiring lines of a switched-capacitor circuit.

According to some exemplary aspects of the disclosure, a tracker module is provided that includes an integrated circuit, a first capacitor and a second capacitor arranged in or on a module laminate. The integrated circuit includes at least one switch in a switched-capacitor circuit of the tracker module and at least one switch in a supply modulator of the tracker module. The switched-capacitor circuit is configured to generate a plurality of discrete voltages. The supply modulator is configured to generate an output voltage by selectively switching among the plurality of discrete voltages based on a control signal. The first capacitor is a flying capacitor of the switched-capacitor circuit. The second capacitor is a smoothing capacitor of the switched-capacitor circuit. In a plan view of the module laminate, the first capacitor is arranged closer to the integrated circuit than the capacitor.

In another exemplary aspect, a tracker module according to an exemplary aspect is provided that includes a module laminate, at least one integrated circuit arranged in or on the module laminate, and a first capacitor and a second capacitor arranged in or on the module laminate. The at least one integrated circuit includes at least one switch included in a switched-capacitor circuit configured to generate, based on an input voltage, a plurality of discrete voltages, and at least one switch included in a supply modulator configured to output at least one out of the plurality of discrete voltages in a selective manner based on an envelope signal. The first capacitor is a first flying capacitor included in the switched-capacitor circuit. The second capacitor is a smoothing capacitor included in the switched-capacitor circuit. In a plan view of the module laminate, the first capacitor is arranged closer to the at least one integrated circuit than the second capacitor.

In another exemplary aspect, a tracker module according to an exemplary aspect is provided that includes a module laminate, at least one integrated circuit arranged in or on the module laminate, and a first capacitor and a second capacitor arranged in or on the module laminate. The at least one integrated circuit includes at least one switch included in a switched-capacitor circuit configured to generate, based on an input voltage, a plurality of discrete voltages, and at least one switch included in a supply modulator having a control terminal connected to a control circuit and configured to output at least one out of the plurality of discrete voltages in a selective manner. The first capacitor is a first flying capacitor included in the switched-capacitor circuit. The second capacitor is a smoothing capacitor included in the switched-capacitor circuit. In a plan view of the module laminate, the first capacitor is arranged closer to the at least one integrated circuit than the second capacitor.

In yet another exemplary aspect, a tracker module is provided that includes a module laminate, at least one integrated circuit arranged in or on the module laminate, and a first capacitor, a second capacitor, and a third capacitor arranged in or on the module laminate. The at least one integrated circuit includes at least one switch included in a switched-capacitor circuit, and at least one switch included in a supply modulator. The switched-capacitor circuit includes the first capacitor having a first electrode and a second electrode, the second capacitor, and the third capacitor having a third electrode and a fourth electrode. The at least one switch included in the switched-capacitor circuit includes a first switch, a second switch, a third switch, a fourth switch, a fifth switch, a sixth switch, a seventh switch, and an eighth switch. One end of the first switch and one end of the third switch are connected to the first electrode. One end of the second switch and one end of the fourth switch are connected to the second electrode. One end of the fifth switch and one end of the seventh switch are connected to the third electrode. One end of the sixth switch and one end of the eighth switch are connected to the fourth electrode. Another end of the first switch, another end of the second switch, another end of the fifth switch, and another end of the sixth switch are connected to the second capacitor. Another end of the third switch is connected to another end of the seventh switch. Another end of the fourth switch is connected to another end of the eighth switch. The supply modulator includes an output terminal. The at least one switch included in the supply modulator includes a ninth switch connected between the other ends of the first, second, fifth, and sixth switches and the output terminal, and a tenth switch connected between the other ends of the third and seventh switches and the output terminal. In a plan view of the module laminate, the first capacitor is arranged closer to the at least one integrated circuit than the second capacitor.

In a tracker module according to the exemplary aspects of the present disclosure, the resistance losses due to the wiring lines of a switched-capacitor circuit are reduced.

DETAILED DESCRIPTION OF EMBODIMENTS

Figure 1:
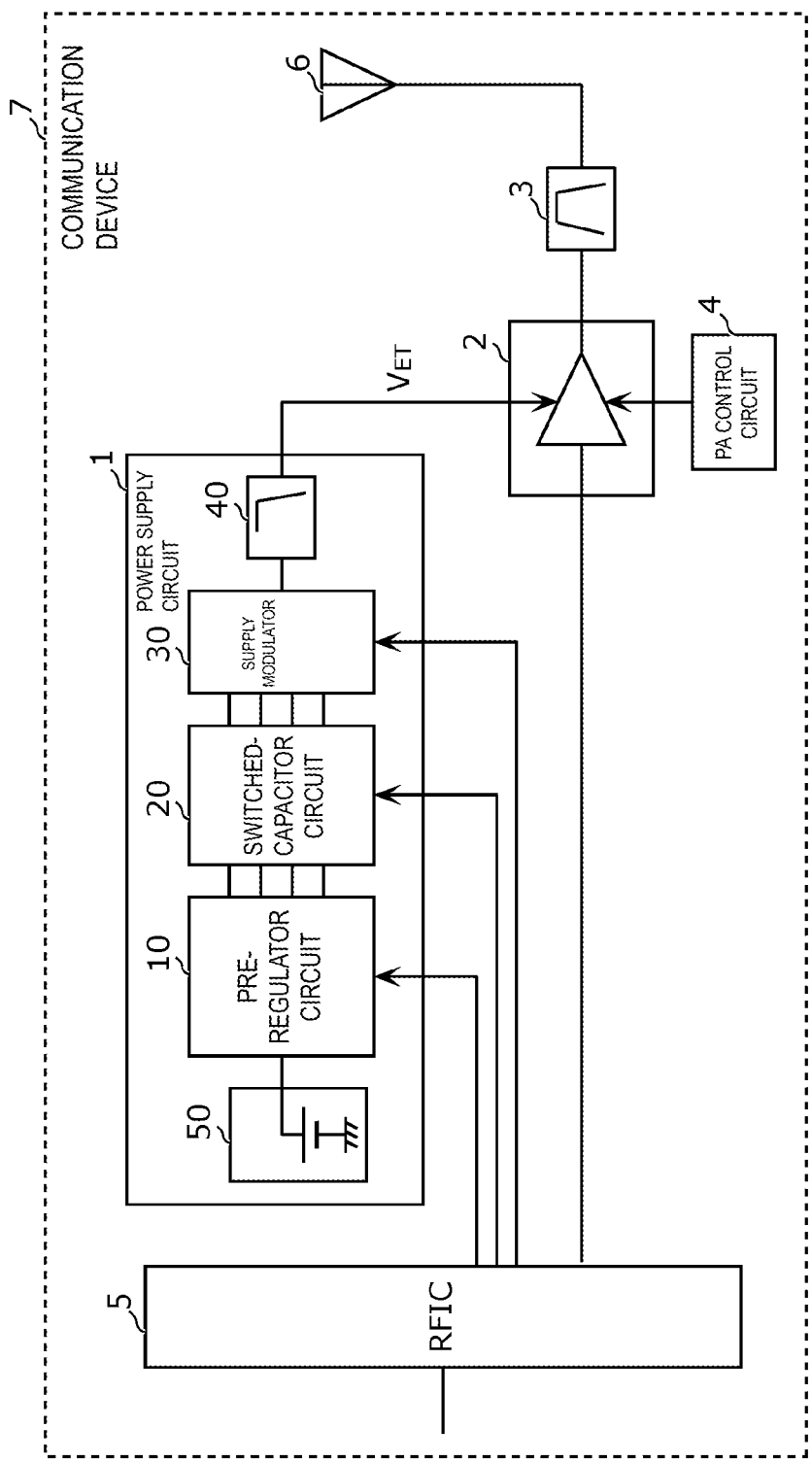
FIG. 1 is a circuit configuration diagram of a communication device according to an exemplary embodiment.

In the following, embodiments according to the present disclosure will be described in detail using the drawings. Note that the embodiments described below are intended to represent both comprehensive and specific examples. Numerical values, shapes, materials, constituent elements, arrangement and connection forms of the constituent elements, and so forth described in the following embodiments are examples and are not intended to limit the present disclosure.

It is noted that each drawing is a schematic diagram in which emphasis, omissions, or ratios are adjusted as necessary to illustrate the present disclosure. The drawings are not necessarily strict illustrations and may differ from the actual shape, positional relationship, and ratios. In each drawing, substantially identical configurations are denoted by the same signs, and redundant description may be omitted or simplified.

In the following each diagram, the x-axis and the y-axis are axes orthogonal to each other on a plane parallel to a main surface of a module laminate. In an exemplary embodiment, when the module laminate is rectangular in a plan view, the x-axis is parallel to a first edge of the module laminate, and the y-axis is parallel to a second edge of the module laminate orthogonal to the first edge. Moreover, the z-axis is an axis perpendicular to the main surface of the module laminate, and its positive direction indicates the upward direction and its negative direction indicates the downward direction.

In circuit configurations of the present disclosure, the term "connected" includes not only cases where a direct connection is established by a connection terminal, a wiring conductor, or a connection terminal and a wiring conductor but also cases where an electrical connection is established using other circuit elements. Moreover, the term "connected between A and B" refers to being connected to both A and B between A and B, and includes, in addition to cases of being connected in series along a path connecting A and B, cases of being connected in parallel (e.g., shunt-connected) between the path and ground.

In the arrangement of components of the present disclosure, the term "a component is arranged in or on a laminate" includes the component being arranged on a main surface of the laminate and the component being arranged in the laminate. Moreover, the term "a component is arranged on a main surface of the laminate" includes the component being arranged in contact with the main surface of the laminate, and also includes the component being arranged above the main surface without being in contact with the main surface (for example, the component being stacked on another component arranged in contact with the main surface). Moreover, the term "a component is arranged on a main surface of the laminate" includes the component being arranged in a recess formed in the main surface in some exemplary embodiments. The term "a component is arranged in the laminate" includes the component being encapsulated within the module laminate. The term "a component is arranged in the laminate" also includes the entire component being arranged between both main surfaces of the laminate but having part left uncovered by the laminate and includes only part of the component being arranged in the laminate.

In the arrangement of components of the present disclosure, the term "a module laminate is viewed in a plan view" refers to viewing an object from the positive side of the z-axis in an orthographic projection onto the xy-plane. Moreover, the term "A overlaps B in a plan view" means that the region of A orthographically projected onto the xy-plane overlaps the region of B orthographically projected onto the xy-plane.

In the arrangement of components of the present disclosure, the term "C is arranged closer to A than B is" means that the distance between A and C is shorter than the distance between A and B. In this case, "the distance between A and B" refers to the shortest distance between A and B. That is, "the distance between A and B" refers to the length of the shortest line segment among a plurality of line segments connecting any point on the surface of A and any point on the surface of B.

EXEMPLARY EMBODIMENT

In the following, a tracker module and a communication device according to the present embodiment will be described with reference to the drawings.

[1 Circuit Configurations of Communication Device 7 and Power Supply Circuit 1]

The circuit configuration of a communication device 7 according to the present embodiment will be described with reference to FIG. 1. FIG. 1 is a circuit configuration diagram of the communication device 7 according to the present embodiment.

[1.1 Circuit Configuration of Communication Device 7]

First, the circuit configuration of the communication device 7 will be described. As illustrated in FIG. 1, the communication device 7 according to the present embodiment includes a power supply circuit 1, a power amplifier (PA) 2, a filter 3, a PA control circuit 4, a radio frequency integrated circuit (RFIC) 5, and an antenna 6.

The power supply circuit 1 can supply the power amplifier 2 with a power supply voltage $V_{ET}$ in a digital envelope tracking (ET) mode. In the digital ET mode, the voltage level of the power supply voltage $V_{ET}$ is selected from among a plurality of discrete voltage levels on the basis of digital control signals corresponding to an envelope signal and changes with time.

An envelope signal is a signal that indicates the envelope value of a modulated signal (a radio frequency signal). The envelope value is expressed, for example, as the square root of $(I^2+Q^2)$. In this case, (I, Q) represents a constellation point. A constellation point is a point on the constellation diagram that represents a signal modulated by digital modulation. The digital ET mode will be described later in detail using FIGS. 3A and 3B.

It is noted that, in FIG. 1, the power supply circuit 1 supplies the one power amplifier 2 with the one power supply voltage $V_{ET}$. However, the power supply circuit 1, in some exemplary embodiments, can be configured to supply the same power supply voltage $V_{ET}$ to a plurality of power amplifiers. Moreover, the power supply circuit 1 is configured to supply different power supply voltages to a plurality of power amplifiers in some exemplary embodiments.

As illustrated in FIG. 1, the power supply circuit 1 includes a pre-regulator circuit 10, a switched-capacitor circuit 20, a supply modulator 30, a filter circuit 40, and a direct current (DC) power source 50.

The pre-regulator circuit 10 includes a power inductor and a switch. A power inductor is an inductor used to increase and/or reduce a DC voltage. The power inductor is arranged in series along a signal path. Note that the power inductor is connected between a signal path and ground (i.e., arranged in parallel) in some exemplary embodiments. The pre-regulator circuit 10 can convert the input voltage into a first voltage using the power inductor. The pre-regulator circuit 10 may also be called a magnetic regulator or a DC/DC converter.

It is noted that the pre-regulator circuit 10 does not have to have a power inductor, and in some exemplary embodiments, also includes a circuit or the like that increases voltage by switching capacitors arranged along a series arm path and a parallel arm path, in a respective manner, of the pre-regulator circuit 10, for example. Moreover, the pre-regulator circuit 10 has a transformer in some exemplary embodiments.

The switched-capacitor circuit 20 includes a plurality of capacitors and a plurality of switches, and can generate, from the first voltage from the pre-regulator circuit 10, a plurality of second voltages having a plurality of respective discrete voltage levels as a plurality of discrete voltages. The switched-capacitor circuit 20 may also be called a switched-capacitor voltage balancer according to an exemplary aspect.

The supply modulator 30 can be configured to select, on the basis of digital control signals corresponding to an envelope signal, at least one from among the plurality of second voltages generated by the switched-capacitor circuit 20 and output the selected second voltage(s) to the filter circuit 40.

The filter circuit 40 can be configured to filter the signal (the second voltage(s)) from the supply modulator 30. The filter circuit 40 includes, for example, a low pass filter (LPF).

The DC power source 50 can be configured to supply the pre-regulator circuit 10 with a DC voltage. As the DC power source 50, for example, a rechargeable battery can be used; however, the DC power source 50 is not limited to this.

It is noted that the power supply circuit 1 does not have to include at least one out of the pre-regulator circuit 10, the switched-capacitor circuit 20, the supply modulator 30, the filter circuit 40, and the DC power source 50. For example, the power supply circuit 1 does not have to include the pre-regulator circuit 10, the filter circuit 40, or the DC power source 50. Moreover, any combination from among the pre-regulator circuit 10, the switched-capacitor circuit 20, the supply modulator 30, and the filter circuit 40 is integrated into a single circuit in some exemplary embodiments.

The power amplifier 2 is connected between the RFIC 5 and the filter 3. Furthermore, the power amplifier 2 can receive the power supply voltage $V_{ET}$ from the power supply circuit 1, and can receive a bias signal from the PA control circuit 4. This allows the power amplifier 2 to amplify a transmission signal of a predetermined band received from the RFIC 5.

The filter 3 is connected between the power amplifier 2 and the antenna 6. The filter 3 has a pass band that includes the predetermined band. As a result, the filter 3 allows the transmission signal of the predetermined band amplified by the power amplifier 2 to pass therethrough.

The PA control circuit 4 can be configured to control the power amplifier 2. In an exemplary embodiment, the PA control circuit 4 can supply the power amplifier 2 with a bias signal.

The RFIC 5 is an example of a control circuit, and is an example of a signal processing circuit that processes radio frequency signals. In an exemplary embodiment, the RFIC 5 is configured to perform image processing, such as up-conversion, on the input transmission signal, and supplies the power amplifier 2 with the radio frequency transmission signal generated through the signal processing. Moreover, the RFIC 5 includes a controller that controls the power supply circuit 1. Note that some or all of the functions of the RFIC 5 as a controller are implemented outside the RFIC 5 in some exemplary embodiments.

The antenna 6 transmits a signal of the predetermined band input from the power amplifier 2 through the filter 3.

The predetermined band is a frequency band for a communication system built using a radio access technology (RAT). The predetermined band is predefined by a standardizing body, examples of which include the $3^{rd}$ Generation Partnership Project (3GPP®) and Institute of Electrical and Electronics Engineers (IEEE). Examples of the communication system include the $5^{th}$ Generation New Radio (5G NR) system, the long-term evolution (LTE) system, and a wireless local area network (WLAN) system.

It is noted that the circuit configuration of the communication device 7 illustrated in FIG. 1 is an example and is not limited to this. For example, the communication device 7 does not have to have the antenna 6. Moreover, for example, the communication device 7 may have a plurality of antennas.

[1.2 Circuit Configuration of Power Supply Circuit 1]

Figure 2:
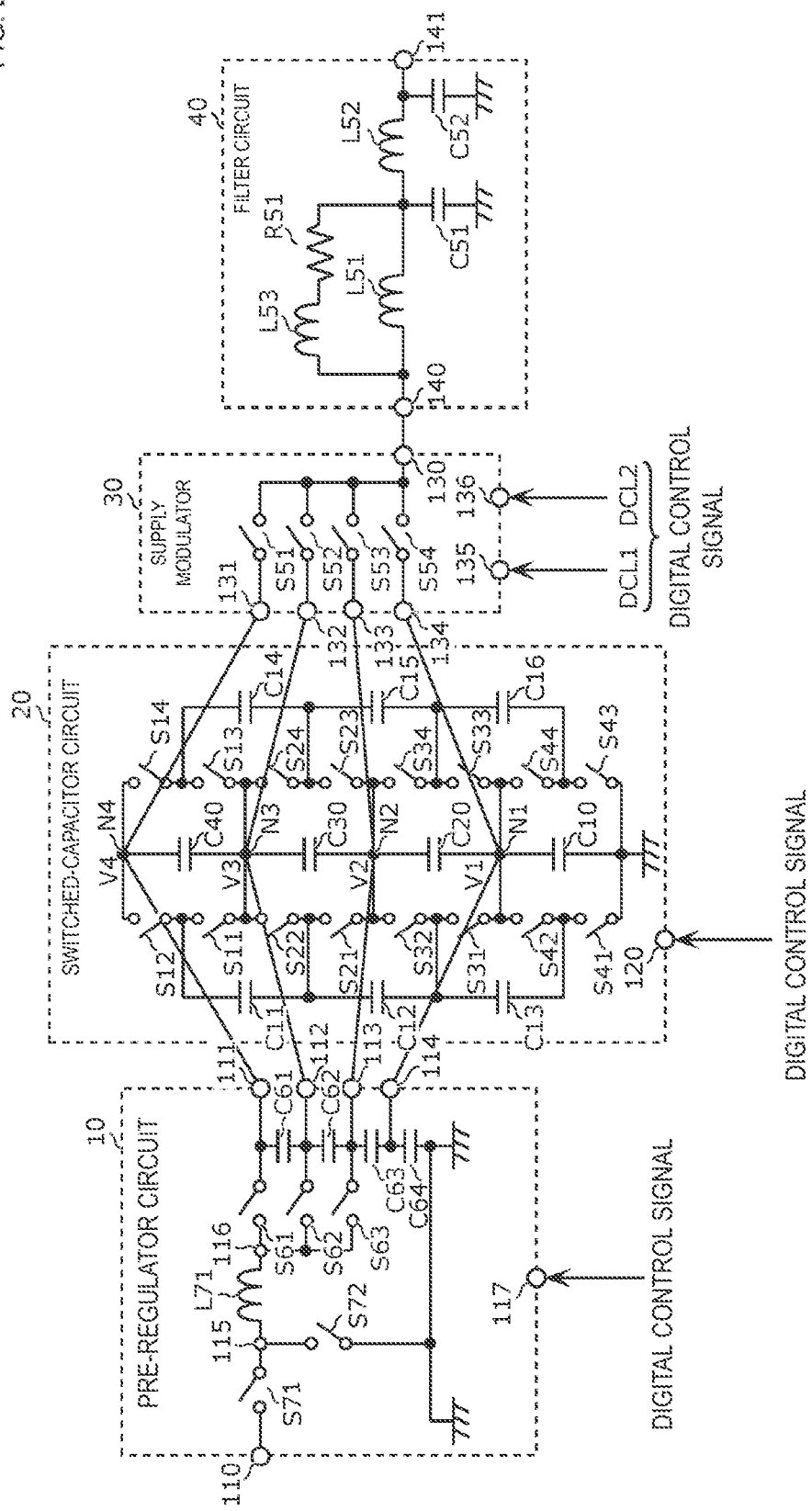
FIG. 2 is a circuit configuration diagram of a pre-regulator circuit, a switched-capacitor circuit, a supply modulator, and a filter circuit according to the exemplary embodiment.

Next, the circuit configurations of the pre-regulator circuit 10, the switched-capacitor circuit 20, the supply modulator 30, and the filter circuit 40 included in the power supply circuit 1 will be described with reference to FIG. 2. FIG. 2 is a circuit configuration diagram of the pre-regulator circuit 10, the switched-capacitor circuit 20, the supply modulator 30, and the filter circuit 40 according to the present embodiment.

Note that FIG. 2 illustrates an exemplary circuit configuration, and the pre-regulator circuit 10, the switched-capacitor circuit 20, the supply modulator 30, and the filter circuit 40 can be implemented using any of a wide variety of circuit implementations and circuit techniques. Thus, description of each circuit provided below is not to be construed in a limited manner.

[1.2.1 Circuit Configuration of Switched-Capacitor Circuit 20]

First, the circuit configuration of the switched-capacitor circuit 20 will be described. As illustrated in FIG. 2, the switched-capacitor circuit 20 includes capacitors C11 to C16, capacitors C10, C20, C30, and C40, switches S11 to S14, S21 to S24, S31 to S34, and S41 to S44, and a control terminal 120. Energy and electric charge are input from the pre-regulator circuit 10 into the switched-capacitor circuit 20 through nodes N1 to N4 and are extracted from the switched-capacitor circuit 20 to the supply modulator 30 through the nodes N1 to N4.

The control terminal 120 is an input terminal for a digital control signal. That is, the control terminal 120 is a terminal for receiving a digital control signal for controlling the switched-capacitor circuit 20. As the digital control signal received through the control terminal 120, for example, a control signal for a source synchronization method for transmitting a data signal and a clock signal can be used; however, the digital control signal is not limited to this. For example, as the digital control signal, a control signal for a clock embedding method in which a clock is embedded in a data signal is used in some exemplary embodiments.

Each of the capacitors C11 to C16 is configured to function as a flying capacitor, which may also be called a transfer capacitor. That is, each of the capacitors C11 to C16 is used to increase or reduce the first voltage supplied from the pre-regulator circuit 10. More specifically, the capacitors C11 to C16 allow electric charge to move between the capacitors C11 to C16 and the nodes N1 to N4 such that voltages V1 to V4 (e.g., voltages relative to a ground potential) at the four nodes N1 to N4 are maintained so as to satisfy V1:V2:V3:V4=1:2:3:4. These voltages V1 to V4 correspond to the plurality of second voltages, which have a plurality of respective discrete voltage levels.

The capacitor C11 is an example of a first capacitor and a first flying capacitor. The capacitor C11 has two electrodes (an example of a first electrode and a second electrode). One of the two electrodes of the capacitor C11 is connected to one end of the switch S11 and one end of the switch S12. The other one of the two electrodes of the capacitor C11 is connected to one end of the switch S21 and one end of the switch S22. For purposes of this disclosure the term "one end" may generally be considered a "first end" and the term "another end" or the "other end" may generally be considered a "second end".

The capacitor C12 is an example of a third capacitor and a second flying capacitor or an example of a fourth capacitor. The capacitor C12 has two electrodes (an example of a fifth electrode and a sixth electrode). One of the two electrodes of the capacitor C12 is connected to the one end of the switch S21 and the one end of the switch S22. The other one of the two electrodes of the capacitor C12 is connected to one end of the switch S31 and one end of the switch S32.

The capacitor C13 has two electrodes. One of the two electrodes of the capacitor C13 is connected to the one end of the switch S31 and the one end of the switch S32. The other one of the two electrodes of the capacitor C13 is connected to one end of the switch S41 and one end of the switch S42.

The capacitor C14 is an example of the third capacitor and has two electrodes (an example of a third electrode and a fourth electrode). One of the two electrodes of the capacitor C14 is connected to one end of the switch S13 and one end of the switch S14. The other one of the two electrodes of the capacitor C14 is connected to one end of the switch S23 and one end of the switch S24.

The capacitor C15 is an example of a fifth capacitor and has two electrodes (an example of a seventh electrode and an eighth electrode). One of the two electrodes of the capacitor C15 is connected to the one end of the switch S23 and the one end of the switch S24. The other one of the two electrodes of the capacitor C15 is connected to one end of the switch S33 and one end of the switch S34.

The capacitor C16 has two electrodes. One of the two electrodes of the capacitor C16 is connected to the one end of the switch S33 and the one end of the switch S34. The other one of the two electrodes of the capacitor C16 is connected to one end of the switch S43 and one end of the switch S44.

A set of the capacitors C11 and C14, a set of the capacitors C12 and C15, a set of the capacitors C13 and C16 can each be complementarily charged and discharged by repeating a first phase and a second phase.

According to some exemplary aspects, in the first phase, the switches S12, S13, S22, S23, S32, S33, S42, and S43 are turned on. As a result, for example, the one of the two electrodes of the capacitor C12 is connected to the node N3, the other one of the two electrodes of the capacitor C12 and the one of the two electrodes of the capacitor C15 are connected to the node N2, and the other one of the two electrodes of the capacitor C15 is connected to the node N1.

In contrast, in the second phase, the switches S11, S14, S21, S24, S31, S34, S41, and S44 are turned on. As a result, for example, the one of the two electrodes of the capacitor C15 is connected to the node N3, the other one of the two electrodes of the capacitor C15 and the one of the two electrodes of the capacitor C12 are connected to the node N2, and the other one of the two electrodes of the capacitor C12 is connected to the node N1.

By repeating the first phase and the second phase, for example, when one of the capacitors C12 and C15 is charged from the node N2, the other one of the capacitors C12 and C15 can be discharged to the capacitor C30. That is, the capacitors C12 and C15 can complementarily be charged and discharged.

Similarly to the set of the capacitors C12 and C15, the set of the capacitors C11 and C14 and the set of the capacitors C13 and C16 can also be complementarily charged and discharged by repeating the first phase and the second phase.

Each of the capacitors C10, C20, C30, and C40 functions as a smoothing capacitor. That is, each of the capacitors C10, C20, C30, and C40 is used to hold and smooth the voltages V1 to V4 at the nodes N1 to N4.

The capacitor C10 is connected between the node N1 and ground. In an exemplary embodiment, one of two electrodes of the capacitor C10 is connected to the node N1. In contrast, the other one of the two electrodes of the capacitor C10 is connected to ground.

The capacitor C20 is connected between the nodes N2 and N1. In an exemplary embodiment, one of two electrodes of the capacitor C20 is connected to the node N2. In contrast, the other one of the two electrodes of the capacitor C20 is connected to the node N1.

The capacitor C30 is an example of a second capacitor and is connected between the nodes N3 and N2. In an exemplary embodiment, one of two electrodes of the capacitor C30 is connected to the node N3. In contrast, the other one of the two electrodes of the capacitor C30 is connected to the node N2.

The capacitor C40 is connected between the nodes N4 and N3. In an exemplary embodiment, one of two electrodes of the capacitor C40 is connected to the node N4. In contrast, the other one of the two electrodes of the capacitor C40 is connected to the node N3.

The switch S11 is an example of a first switch and is connected between the one of the two electrodes of the capacitor C11 and the node N3. In an exemplary embodiment, the one end of the switch S11 is connected to the one of the two electrodes of the capacitor C11. In contrast, the other end of the switch S11 is connected to the node N3.

The switch S12 is an example of a third switch and is connected between the one of the two electrodes of the capacitor C11 and the node N4. In an exemplary embodiment, the one end of the switch S12 is connected to the one of the two electrodes of the capacitor C11. In contrast, the other end of the switch S12 is connected to the node N4.

The switch S21 is an example of a fourth switch and is connected between the one of the two electrodes of the capacitor C12 and the node N2. In an exemplary embodiment, the one end of the switch S21 is connected to the one of the two electrodes of the capacitor C12 and the other one of the two electrodes of the capacitor C11. In contrast, the other end of the switch S21 is connected to the node N2.

The switch S22 is an example of a second switch and is connected between the one of the two electrodes of the capacitor C12 and the node N3. In an exemplary embodiment, the one end of the switch S22 is connected to the one of the two electrodes of the capacitor C12 and the other one of the two electrodes of the capacitor C11. In contrast, the other end of the switch S22 is connected to the node N3.

The switch S31 is an example of a twelfth switch and is connected between the other one of the two electrodes of the capacitor C12 and the node N1. In an exemplary embodiment, the one end of the switch S31 is connected to the other one of the two electrodes of the capacitor C12 and the one of the two electrodes of the capacitor C13. In contrast, the other end of the switch S31 is connected to the node N1.

The switch S32 is an example of an eleventh switch and is connected between the other one of the two electrodes of the capacitor C12 and the node N2. In an exemplary embodiment, the one end of the switch S32 is connected to the other one of the two electrodes of the capacitor C12 and the one of the two electrodes of the capacitor C13. In contrast, the other end of the switch S32 is connected to the node N2. That is, the other end of the switch S32 is connected to the other end of the switch S21.

The switch S41 is connected between the other one of the two electrodes of the capacitor C13 and ground. In an exemplary embodiment, the one end of the switch S41 is connected to the other one of the two electrodes of the capacitor C13. In contrast, the other end of the switch S41 is connected to ground.

The switch S42 is connected between the other one of the two electrodes of the capacitor C13 and the node N1. In an exemplary embodiment, the one end of the switch S42 is connected to the other one of the two electrodes of the capacitor C13. In contrast, the other end of the switch S42 is connected to the node N1. That is, the other end of the switch S42 is connected to the other end of the switch S31.

The switch S13 is an example of a fifth switch and is connected between the one of the two electrodes of the capacitor C14 and the node N3. In an exemplary embodiment, the one end of the switch S13 is connected to the one of the two electrodes of the capacitor C14. In contrast, the other end of the switch S13 is connected to the node N3. That is, the other end of the switch S13 is connected to the other end of the switch S11 and the other end of the switch S22.

The switch S14 is an example of a seventh switch and is connected between the one of the two electrodes of the capacitor C14 and the node N4. In an exemplary embodiment, the one end of the switch S14 is connected to the one of the two electrodes of the capacitor C14. In contrast, the other end of the switch S14 is connected to the node N4. That is, the other end of the switch S14 is connected to the other end of the switch S12.

The switch S23 is an example of an eighth switch and is connected between the one of the two electrodes of the capacitor C15 and the node N2. In an exemplary embodiment, the one end of the switch S23 is connected to the one of the two electrodes of the capacitor C15 and the other one of the two electrodes of the capacitor C14. In contrast, the other end of the switch S23 is connected to the node N2. That is, the other end of the switch S23 is connected to the other end of the switch S21 and the other end of the switch S32.

The switch S24 is an example of a sixth switch and is connected between the one of the two electrodes of the capacitor C15 and the node N3. In an exemplary embodiment, the one end of the switch S24 is connected to the one of the two electrodes of the capacitor C15 and the other one of the two electrodes of the capacitor C14. In contrast, the other end of the switch S24 is connected to the node N3. That is, the other end of the switch S24 is connected to the other end of the switch S11, the other end of the switch S22, and the other end of the switch S13.

The switch S33 is an example of a fourteenth switch and is connected between the other one of the two electrodes of the capacitor C15 and the node N1. In an exemplary embodiment, the one end of the switch S33 is connected to the other one of the two electrodes of the capacitor C15 and the one of the two electrodes of the capacitor C16. In contrast, the other end of the switch S33 is connected to the node N1. That is, the other end of the switch S33 is connected to the other end of the switch S31 and the other end of the switch S42.

The switch S34 is an example of a thirteenth switch and is connected between the other one of the two electrodes of the capacitor C15 and the node N2. In an exemplary embodiment, the one end of the switch S34 is connected to the other one of the two electrodes of the capacitor C15 and the one of the two electrodes of the capacitor C16. In contrast, the other end of the switch S34 is connected to the node N2. That is, the other end of the switch S34 is connected to the other end of the switch S21, the other end of the switch S32, and the other end of the switch S23.

The switch S43 is connected between the other one of the two electrodes of the capacitor C16 and ground. In an exemplary embodiment, the one end of the switch S43 is connected to the other one of the two electrodes of the capacitor C16. In contrast, the other end of the switch S43 is connected to ground.

The switch S44 is connected between the other one of the two electrodes of the capacitor C16 and the node N1. In an exemplary embodiment, the one end of the switch S44 is connected to the other one of the two electrodes of the capacitor C16. In contrast, the other end of the switch S44 is connected to the node N1. That is, the other end of the switch S44 is connected to the other end of the switch S31, the other end of the switch S42, and the other end of the switch S33.

A first set of switches including the switches S12, S13, S22, S23, S32, S33, S42, and S43 and a second set of switches including the switches S11, S14, S21, S24, S31, S34, S41, and S44 are turned on and off complementarily. In an exemplary embodiment, in the first phase, the first set of switches is turned on, and the second set of switches is turned off. In contrast, in the second phase, the first set of switches is turned off, and the second set of switches is turned on.

For example, charging from the capacitors C11 to C13 to the capacitors C10 to C40 is performed in one of the first phase and the second phase, and charging from the capacitors C14 to C16 to the capacitors C10 to C40 is performed in the other one of the first phase and the second phase. That is, the capacitors C10 to C40 are always charged from the capacitors C11 to C13 or the capacitors C14 to C16. Thus, even when current flows at high speed from the nodes N1 to N4 to the supply modulator 30, the nodes N1 to N4 are replenished with electric charge at high speed, so that the potential fluctuations of the nodes N1 to N4 can be suppressed.

By operating in this manner, the switched-capacitor circuit 20 can maintain approximately equal voltages at both ends of each of the capacitors C10, C20, C30, and C40. In an exemplary embodiment, the voltages V1 to V4 (e.g., voltages relative to the ground potential) that satisfy V1:V2:V3:V4=1:2:3:4 are maintained at the four nodes labeled V1 to V4. The voltage levels of the voltages V1 to V4 correspond to the plurality of discrete voltage levels that can be supplied by the switched-capacitor circuit 20 to the supply modulator 30.

According to an exemplary aspect of the disclosure, the voltage ratio V1:V2:V3:V4 is not limited to 1:2:3:4. For example, the voltage ratio V1:V2:V3:V4 is 1:2:4:8 in some exemplary embodiments.

Moreover, the configuration of the switched-capacitor circuit 20 illustrated in FIG. 2 is an example and is not limited to this. In FIG. 2, the switched-capacitor circuit 20 is configured to supply four discrete voltage levels of voltage, but it is not limited to this. In some exemplary embodiments, the switched-capacitor circuit 20 is configured to supply a certain number of discrete voltage levels of voltage, the certain number being greater than or equal to two. For example, when two discrete voltage levels of voltage are to be supplied, it is sufficient that the switched-capacitor circuit 20 include at least the capacitors C11, C14, and C30 and the switches S11 to S14 and S21 to S24.

[1.2.2 Circuit Configuration of Supply Modulator 30]

Next, the circuit configuration of the supply modulator 30 will be described. As illustrated in FIG. 2, the supply modulator 30 includes input terminals 131 to 134, switches S51 to S54, an output terminal 130, and control terminals 135 and 136.

The output terminal 130 is connected to the filter circuit 40. The output terminal 130 is a terminal for supplying the filter circuit 40 with a voltage selected from among the voltages V1 to V4.

The input terminals 131 to 134 are connected to the nodes N4 to N1 of the switched-capacitor circuit 20, respectively. The input terminals 131 to 134 are terminals for receiving the voltages V4 to V1 from the switched-capacitor circuit 20.

The control terminals 135 and 136 are input terminals for digital control signals. That is, the control terminals 135 and 136 are terminals for receiving digital control signals that indicate one out of the voltages V1 to V4. The supply modulator 30 is configured to control on/off of the switches S51 to S54 so as to select the voltage level indicated by the digital control signals.

Two digital control logic (DCL: Digital Control Logic/Line) signals can be used as the digital control signals received through the control terminals 135 and 136. Each of the two DCL signals is a 1-bit signal. Each of the voltages V1 to V4 is expressed by a combination of two 1-bit signals. For example, V1, V2, V3, and V4 are expressed as "00", "01", "10", and "11", respectively. Gray codes are used to express the voltage levels in some exemplary embodiments.

Note that two DCL signals are used in the present embodiment, but the number of DCL signals is not limited to this. For example, in some exemplary embodiments, a certain number of DCL signals are used in accordance with the number of voltage levels, the certain number being greater than or equal to three. Moreover, the digital control signals are not limited to DCL signals and are control signals for a source synchronization method in some exemplary embodiments.

The switch S51 is an example of a tenth switch and is connected between the input terminal 131 and the output terminal 130. In an exemplary embodiment, the switch S51 has a terminal connected to the input terminal 131 and a terminal connected to the output terminal 130. In this connection configuration, the switch S51 can switch connection and disconnection between the input terminal 131 and the output terminal 130 by switching on and off.

The switch S52 is an example of a ninth switch and is connected between the input terminal 132 and the output terminal 130. In an exemplary embodiment, the switch S52 has a terminal connected to the input terminal 132 and a terminal connected to the output terminal 130. In this connection configuration, the switch S52 can switch connection and disconnection between the input terminal 132 and the output terminal 130 by switching on and off.

The switch S53 is connected between the input terminal 133 and the output terminal 130. In an exemplary embodiment, the switch S53 has a terminal connected to the input terminal 133 and a terminal connected to the output terminal 130. In this connection configuration, the switch S53 can switch connection and disconnection between the input terminal 133 and the output terminal 130 by switching on and off.

The switch S54 is connected between the input terminal 134 and the output terminal 130. In an exemplary embodiment, the switch S54 has a terminal connected to the input terminal 134 and a terminal connected to the output terminal 130. In this connection configuration, the switch S54 can switch connection and disconnection between the input terminal 134 and the output terminal 130 by switching on and off.

These switches S51 to S54 are controlled to be ON exclusively. That is, only one of the switches S51 to S54 is turned on, and the rest of the switches S51 to S54 are turned off. As a result, the supply modulator 30 can output one voltage selected from among the voltages V1 to V4.

Note that the configuration of the supply modulator 30 illustrated in FIG. 2 is an example and is not limited to this. In particular, it is sufficient that the switches S51 to S54 select at least one out of the four input terminals 131 to 134 and the at least one selected input terminal be connected to the output terminal 130, and any configuration may be used. For example, the supply modulator 30 may further include a switch connected between the switches S51 to S53 and the switch S54 and output terminal 130 according to an exemplary aspect. Moreover, for example, the supply modulator 30 may further include a switch connected between the switches S51 and S52 and the switches S53 and S54 and output terminal 130.

In some exemplary embodiments, the supply modulator 30 is configured to output two or more voltages. In this case, it is sufficient that the supply modulator 30 be further provided with as many additional sets of switches and additional output terminals as necessary, with a configuration similar to that of the set of the switches S51 to S54.

Note that when two discrete voltage levels of voltage are to be supplied from the switched-capacitor circuit 20, it is sufficient that the supply modulator 30 be provided with at least the switches S51 and S52.

[1.2.3 Circuit Configuration of Pre-Regulator Circuit 10]

First, the configuration of the pre-regulator circuit 10 will be descried. As illustrated in FIG. 2, the pre-regulator circuit 10 includes an input terminal 110, output terminals 111 to 114, inductor connection terminals 115 and 116, a control terminal 117, switches S61 to S63, S71, and S72, a power inductor L71, and capacitors C61 to C64.

The input terminal 110 is an input terminal for DC voltage. That is, the input terminal 110 is a terminal for receiving an input voltage from the DC power source 50.

The output terminal 111 is an output terminal for the voltage V4. That is, the output terminal 111 is a terminal for supplying the voltage V4 to the switched-capacitor circuit 20. The output terminal 111 is connected to the node N4 of the switched-capacitor circuit 20.

The output terminal 112 is an output terminal for the voltage V3. That is, the output terminal 112 is a terminal for supplying the voltage V3 to the switched-capacitor circuit 20. The output terminal 112 is connected to the node N3 of the switched-capacitor circuit 20.

The output terminal 113 is an output terminal for the voltage V2. That is, the output terminal 113 is a terminal for supplying the voltage V2 to the switched-capacitor circuit 20. The output terminal 113 is connected to the node N2 of the switched-capacitor circuit 20.

The output terminal 114 is an output terminal for the voltage V1. That is, the output terminal 114 is a terminal for supplying the voltage V1 to the switched-capacitor circuit 20. The output terminal 114 is connected to the node N1 of the switched-capacitor circuit 20.

The inductor connection terminal 115 is connected to one end of the power inductor L71. The inductor connection terminal 116 is connected to the other end of the power inductor L71.

The control terminal 117 is an input terminal for a digital control signal. That is, the control terminal 117 is a terminal for receiving a digital control signal for controlling the pre-regulator circuit 10. As the digital control signal received through the control terminal 117, for example, a control signal for a source synchronization method for transmitting a data signal and a clock signal can be used. However, the digital control signal is not limited to this. For example, as the digital control signal, a control signal for a clock embedding method in which a clock is embedded in a data signal can be used. In some exemplary embodiments, the control terminal 117 and the control terminal 120 are combined into one terminal.

The switch S71 is connected between the input terminal 110 and the one end of the power inductor L71. In an exemplary embodiment, the switch S71 has a terminal connected to the input terminal 110 and a terminal connected to the one end of the power inductor L71 with the inductor connection terminal 115 interposed therebetween. In this connection configuration, the switch S71 can switch connection and disconnection between the input terminal 110 and the one end of the power inductor L71 by switching on and off.

The switch S72 is connected between the one end of the power inductor L71 and ground. In an exemplary embodiment, the switch S72 has a terminal connected to the one end of the power inductor L71 with the inductor connection terminal 115 interposed therebetween and a terminal connected to ground. In this connection configuration, the switch S72 can switch connection and disconnection between the one end of the power inductor L71 and ground by switching on and off.

The switch S61 is connected between the other end of the power inductor L71 and the output terminal 111. In an exemplary embodiment, the switch S61 has a terminal connected to the other end of the power inductor L71 and a terminal connected to the output terminal 111. In this connection configuration, the switch S61 can switch connection and disconnection between the other end of the power inductor L71 and the output terminal 111 by switching on and off.

The switch S62 is connected between the other end of the power inductor L71 and the output terminal 112. In an exemplary embodiment, the switch S62 has a terminal connected to the other end of the power inductor L71 and a terminal connected to the output terminal 112. In this connection configuration, the switch S62 can switch connection and disconnection between the other end of the power inductor L71 and the output terminal 112 by switching on and off.

The switch S63 is connected between the other end of the power inductor L71 and the output terminal 113. In an exemplary embodiment, the switch S63 has a terminal connected to the other end of the power inductor L71 and a terminal connected to the output terminal 113. In this connection configuration, the switch S63 can switch connection and disconnection between the other end of the power inductor L71 and the output terminal 113 by switching on and off.

One of two electrodes of the capacitor C61 is connected to the switch S61 and the output terminal 111. The other one of the two electrodes of the capacitor C61 is connected to the switch S62, the output terminal 112, and one of two electrodes of the capacitor C62.

The one of the two electrodes of the capacitor C62 is connected to the switch S62, the output terminal 112, and the other one of the two electrodes of the capacitor C61. The other one of the two electrodes of the capacitor C62 is connected to a path that connects the switch S63, the output terminal 113, and one of two electrodes of the capacitor C63.

The one of the two electrodes of the capacitor C63 is connected to the switch S63, the output terminal 113, and the other one of the two electrodes of the capacitor C62. The other one of the two electrodes of the capacitor C63 is connected to the output terminal 114 and one of two electrodes of the capacitor C64.

The one of the two electrodes of the capacitor C64 is connected to the output terminal 114 and the other one of the two electrodes of the capacitor C63. The other one of the two electrodes of the capacitor C64 is connected to ground.

The switches S61 to S63 are controlled to be ON exclusively. That is, only one of the switches S61 to S63 is turned on, and the rest of the switches S61 to S63 are turned off. By turning on any one of the switches S61 to S63, the pre-regulator circuit 10 can change the voltage to be supplied to the switched-capacitor circuit 20 between the voltage levels of the voltages V2 to V4.

The pre-regulator circuit 10 configured in this manner can supply electric charge to the switched-capacitor circuit 20 via at least one out of the output terminals 111 to 113.

Note that when the input voltage is converted into one first voltage, it is sufficient that the pre-regulator circuit 10 include at least the switches S71 and S72 and the power inductor L71.

[1.2.4 Circuit Configuration of Filter Circuit 40]

Next, the circuit configuration of the filter circuit 40 will be described. As illustrated in FIG. 2, the filter circuit 40 is an RLC circuit and includes inductors L51 to L53, capacitors C51 and C52, a resistor R51, an input terminal 140, and an output terminal 141.

The input terminal 140 is an input terminal for the voltage selected by the supply modulator 30. That is, the input terminal 140 is a terminal for receiving the voltage selected from among the plurality of voltages V1 to V4.

The output terminal 141 is an output terminal for the power supply voltage $V_{ET}$. That is, the output terminal 141 is a terminal for supplying the power supply voltage $V_{ET}$ to the power amplifier 2.

According to an exemplary aspect, the inductors L51 to L53, the capacitors C51 and C52, and the resistor R51 form a low pass filter (LPF). As a result, the filter circuit 40 can reduce the radio frequency (RF) component included in the power supply voltage. For example, when the predetermined band is a frequency band for frequency division duplex (FDD), the filter circuit 40 is configured to reduce the frequency components of the gap between the uplink operating band and the downlink operating band of the predetermined band.

Note that the configuration of the filter circuit 40 illustrated in FIG. 2 is an example and is not limited to this. For example, the filter circuit 40 does not have to include the inductor L53 and the resistor R51. For example, the filter circuit 40 may include an inductor connected to one of two electrodes of the capacitor C51 and may include an inductor connected to one of two electrodes of the capacitor C52.

[2 Description of Digital ET Mode]

Figure 3A:
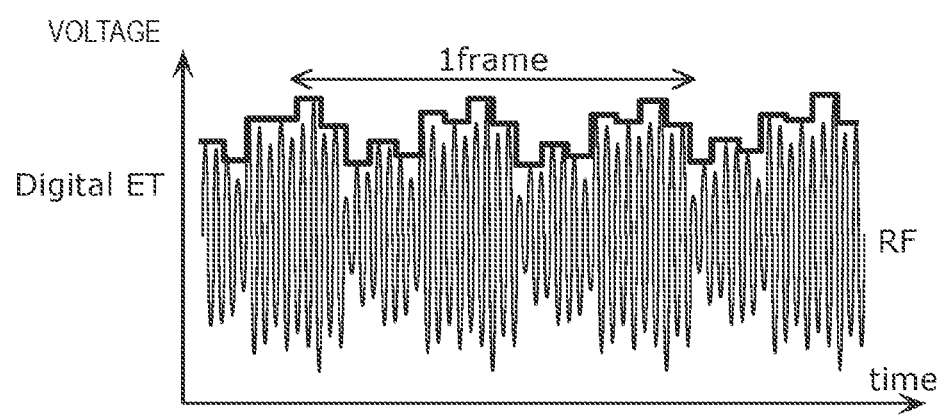
FIG. 3A is a graph illustrating power supply voltage supplied using digital envelope tracking.
Figure 3B:
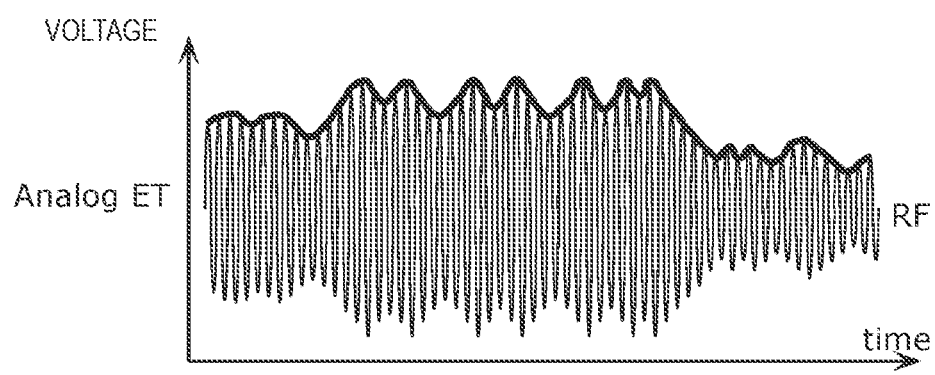
FIG. 3B is a graph illustrating power supply voltage supplied using analog envelope tracking.

In this case, the digital ET mode will be described with reference to FIGS. 3A and 3B while making comparisons with an existing ET mode (hereinafter referred to as an analog ET mode). FIG. 3A is a graph illustrating an example of transition of power supply voltage in the digital ET mode. FIG. 3B is a graph illustrating an example of transition of power supply voltage in the analog ET mode. In FIGS. 3A and 3B, the horizontal axis represents time, and the vertical axis represents voltage. Moreover, the thick solid lines represent power supply voltages, and the thin solid lines (waveforms) represent modulated signals.

In the digital ET mode, as illustrated in FIG. 3A, a modulated signal envelope is tracked by varying the power supply voltage to a plurality of discrete voltage levels within one frame. As a result, the signal of the power supply voltage forms a rectangular wave. In the digital ET mode, the level of the power supply voltage level is selected or set from among the plurality of discrete voltage levels on the basis of the envelope signal.

For purposes of this disclosure, frames refer to units that form a radio frequency signal (e.g., a modulated signal). For example, in 5GNR and LTE, a frame includes 10 subframes, each subframe includes a plurality of slots, and each slot is composed of a plurality of symbols. The subframe length is 1 ms, and the frame length is 10 ms.

In the analog ET mode, as illustrated in FIG. 3B, a modulated signal envelope is tracked by continuously varying the power supply voltage. In the analog ET mode, the power supply voltage is determined on the basis of the envelope signal. It is noted that in the analog ET mode, when the modulated signal envelope changes at high speed, it is difficult for the power supply voltage to track the envelope.

[3 Component Arrangement of Tracker Module 100]

Next, as an example of the power supply circuit 1 configured as described above, a tracker module 100 will be described with reference to FIGS. 4 to 6. In the tracker module 100, the pre-regulator circuit 10 (except for the power inductor L71), the switched-capacitor circuit 20, the supply modulator 30, and the filter circuit 40 are mounted. Note that the power inductor L71 included in the pre-regulator circuit 10 is not included in the tracker module 100.

Figure 4:
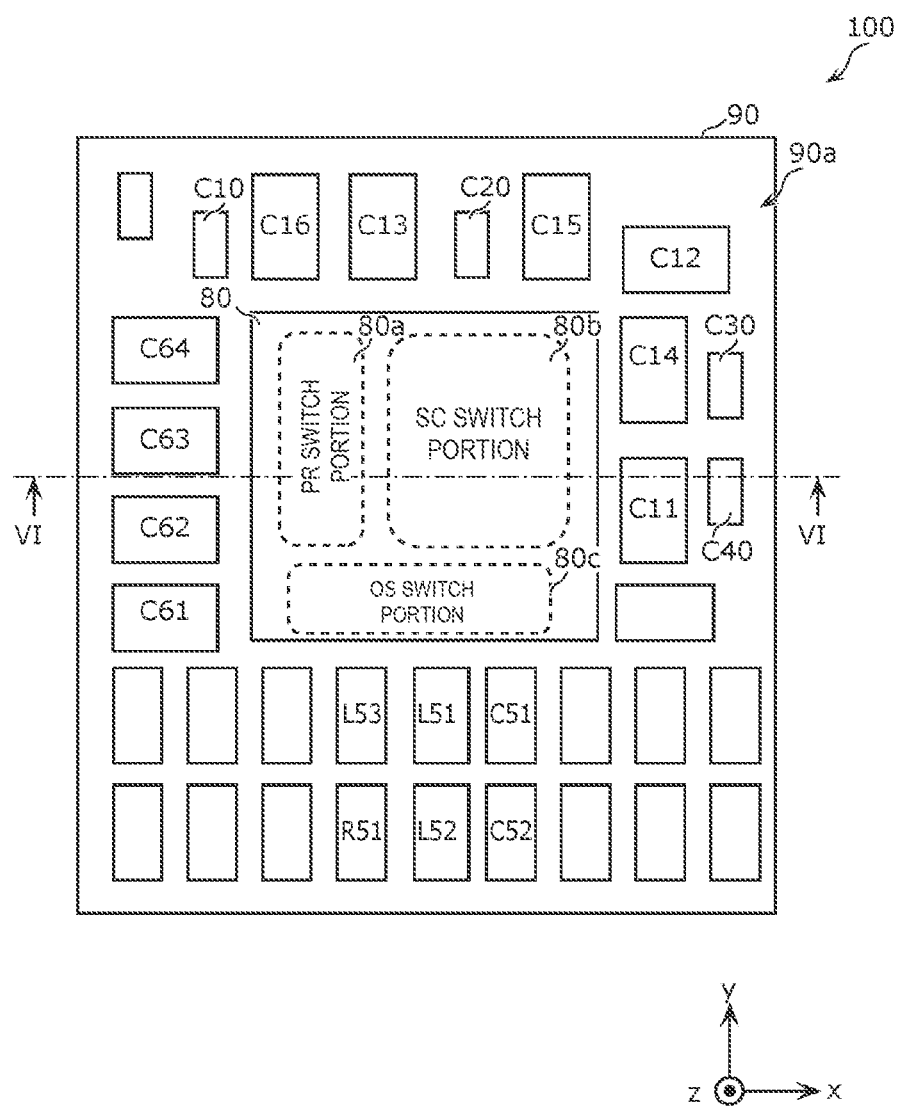
FIG. 4 is a plan view of a tracker module according to some exemplary embodiments.

FIG. 4 is a plan view of the tracker module 100 according to the present example. FIG. 5 is a plan view of the tracker module 100 according to the present example and is a diagram of a main surface 90b side of a module laminate 90 in a see-through manner from the z-axis positive side. FIG. 6 is a cross-sectional view of the tracker module 100 according to the present example. The cross section of the tracker module 100 in FIG. 6 is a cross section taken along lines VI-VI of FIGS. 4 and 5.

Figure 5:
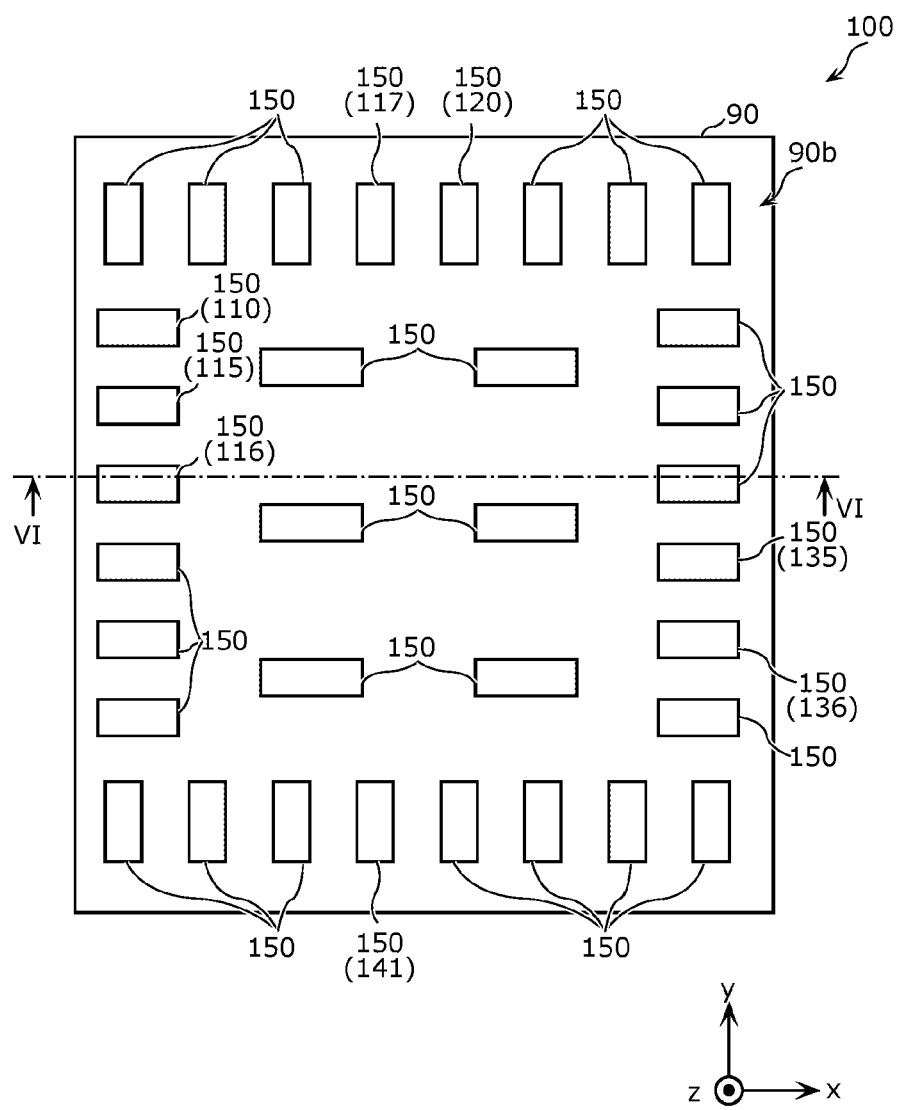
FIG. 5 is a plan view of the tracker module according to some exemplary embodiments.
Figure 6:
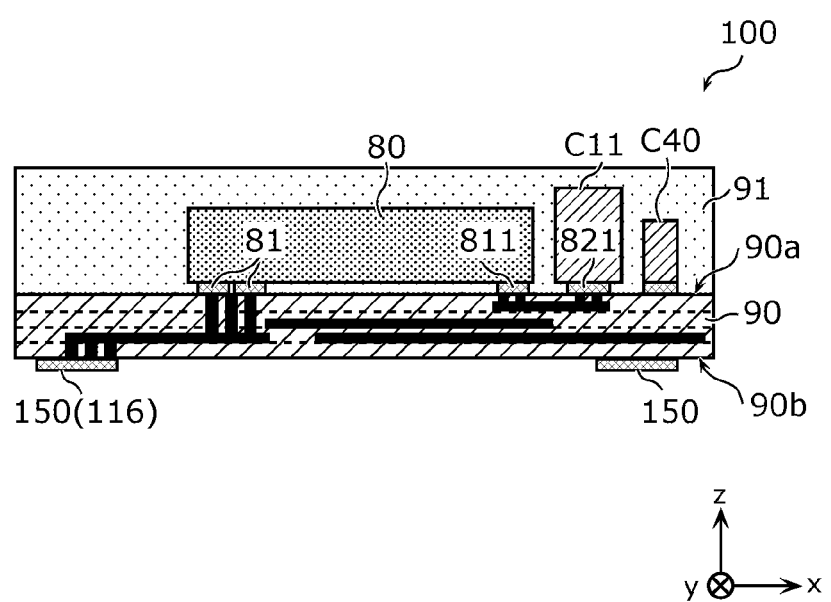
FIG. 6 is a cross-sectional view of the tracker module according to some exemplary embodiments.

Note that in FIGS. 4 to 6, illustration of some of the wiring lines that connect a plurality of circuit components arranged in or on the module laminate 90 is omitted. In FIG. 4, illustration of a resin member 91 that covers a plurality of circuit components is omitted. In FIG. 4, blocks without signs represent any circuit components that are inessential to the present disclosure.

The tracker module 100 includes the module laminate 90, the resin member 91, and a plurality of land electrodes 150 in addition to a plurality of circuit components including active elements and passive elements (except for the power inductor L71) included in the pre-regulator circuit 10, the switched-capacitor circuit 20, the supply modulator 30, and the filter circuit 40 illustrated in FIG. 2.

The module laminate 90 has main surfaces 90a and 90b facing each other. In the module laminate 90, a wiring layer, via conductors, a ground plane, and so on are formed. Note that in FIGS. 4 and 5, the module laminate 90 has a rectangular shape in a plan view but is not limited to this shape.

As the module laminate 90, for example, a low temperature co-fired ceramics (LTCC) substrate or high temperature co-fired ceramics (HTCC) substrate having a multilayer structure formed by a plurality of dielectric layers, a component-embedded board, a substrate having a redistribution layer (RDL), a printed circuit board, or the like can be used. However, it should be appreciated the module laminate 90 is not limited to these example components.

On the main surface 90a, an integrated circuit 80, the capacitors C10 to C16, C20, C30, C40, C51, C52, and C61 to C64, the inductors L51 to L53, the resistor R51, and the resin member 91 are arranged.

The integrated circuit 80 includes a PR switch portion 80a, an SC switch portion 80b, an OS switch portion 80c, and a plurality of bump electrodes 81. The PR switch portion 80a includes the switches S61 to S63, S71, and S72. The SC switch portion 80b is an example of a first switch portion and includes the switches S11 to S14, S21 to S24, S31 to S34, and S41 to S44. The OS switch portion 80c is an example of a second switch portion and includes the switches S51 to S54.

Note that in FIG. 4, the PR switch portion 80a, the SC switch portion 80b, and the OS switch portion 80c are included in the integrated circuit 80, which is a single integrated circuit, but do not have to be included in a single integrated circuit. For example, in some exemplary embodiments, the PR switch portion 80a and the SC switch portion 80b are included in a single integrated circuit, and the OS switch portion 80c is included in another integrated circuit. Moreover, in some exemplary embodiments, the SC switch portion 80b and the OS switch portion 80c are included in a single integrated circuit, and the PR switch portion 80a is included in another integrated circuit. In some exemplary embodiments, the PR switch portion 80a and the OS switch portion 80c are included in a single integrated circuit, and the SC switch portion 80b is included in another integrated circuit. Moreover, in some exemplary embodiments, the PR switch portion 80a, the SC switch portion 80b, and the OS switch portion 80c are included individually in three integrated circuits.

In FIG. 4, the integrated circuit 80 has a rectangular shape in a plan view of the module laminate 90 but is not limited to this shape.

The integrated circuit 80 is composed of, for example, a complementary metal oxide semiconductor (CMOS) and is specifically manufactured using the Silicon on Insulator (SOI) process in some exemplary embodiments. However, it should be appreciated that the integrated circuit 80 is not limited to a CMOS.

Moreover, the plurality of bump electrodes 81 are electrically connected to, for example, a plurality of electronic components arranged on the main surface 90a or the plurality of land electrodes 150 arranged on the main surface 90b via the wiring layer or via conductors formed in the module laminate 90.

Each of the capacitors C10 to C16, C20, C30, C40, C51, C52, and C61 to C64 is mounted as a chip capacitor. A chip capacitor refers to a surface mount device (SMD) that is included in a capacitor. Note that the plurality of capacitors that are mounted are not limited to chip capacitors. For example, the plurality of capacitors is included in an integrated passive device (IPD) in some exemplary embodiments.

In a plan view of the module laminate 90, the capacitor C11 is arranged closer to the integrated circuit 80 than the capacitor C30 is. That is, the distance between the capacitor C11 and the integrated circuit 80 is shorter than the distance between the capacitor C30 and the integrated circuit 80.

In the plan view of the module laminate 90, the size of each of the capacitors C11 to C16 functioning as flying capacitors of the switched-capacitor circuit 20 is larger than the size of each of the capacitors C10, C20, C30, and C40 functioning as smoothing capacitors of the switched-capacitor circuit 20. That is, the area of the region of each of the capacitors C11 to C16 orthographically projected onto the xy-plane is larger than the area of the region of each of the capacitors C10, C20, C30, and C40 orthographically projected onto the xy-plane.

Each of the inductors L51 to L53 is mounted as a chip inductor. A chip inductor refers to an SMD that is included in an inductor. Note that the plurality of inductors that are mounted are not limited to chip inductors. For example, the plurality of inductors is included in an IPD in some exemplary embodiments.

The resistor R51 is mounted as a chip resistor. A chip resistor refers to an SMD that is included in a resistor. Note that the resistor R51 that is mounted is not limited to a chip resistor. For example, the resistor R51 is included in an IPD in some exemplary embodiments.

The plurality of capacitors, the plurality of inductors, and the resistor that are arranged on the main surface 90a in this manner are grouped by the type of circuit and are arranged around the integrated circuit 80.

In an exemplary embodiment, in the plan view of the module laminate 90, the group of the capacitors C61 to C64 included in the pre-regulator circuit 10 are arranged in a region on the main surface 90a sandwiched by a straight line along the left edge of the integrated circuit 80 and a straight line along the left edge of the module laminate 90. Consequently, the group of circuit components included in the pre-regulator circuit 10 is arranged close to the PR switch portion 80a in the integrated circuit 80. As a result, the PR switch portion 80a is arranged closer to each of the capacitors C61 to C64 than the SC switch portion 80b and the OS switch portion 80c are.

In the plan view of the module laminate 90, the group of the capacitors C10 to C16, C20, C30, and C40 included in the switched-capacitor circuit 20 are arranged in a region on the main surface 90a sandwiched by a straight line along the upper edge of the integrated circuit 80 and a straight line along the upper edge of the module laminate 90 and a region on the main surface 90a sandwiched by a straight line along the right edge of the integrated circuit 80 and a straight line along the right edge of the module laminate 90. Consequently, the group of circuit components included in the switched-capacitor circuit 20 are arranged close to the SC switch portion 80b in the integrated circuit 80. As a result, the SC switch portion 80b is arranged closer to each of the capacitors C10 to C16, C20, C30, and C40 than the PR switch portion 80a and the OS switch portion 80c are.

In the plan view of the module laminate 90, the group of the capacitors C51 and C52, the inductors L51 to L53, and the resistor R51 included in the filter circuit 40 are arranged in a region on the main surface 90a sandwiched by a straight line along the lower edge of the integrated circuit 80 and a straight line along the lower edge of the module laminate 90. Consequently, the group of circuit components included in the filter circuit 40 are arranged close to the OS switch portion 80c in the integrated circuit 80. As a result, the OS switch portion 80c is arranged closer to each of the capacitors C51 and C52, the inductors L51 to L53, and the resistor R51 than the PR switch portion 80a and the SC switch portion 80b are.

On the main surface 90b, the plurality of land electrodes 150 are arranged. The plurality of land electrodes 150 function as a plurality of external connection terminals including a ground terminal in addition to the input terminal 110, the output terminal 141, the inductor connection terminals 115 and 116, and the control terminals 117, 120, 135, and 136 illustrated in FIG. 2. The plurality of land electrodes 150 are electrically connected to the plurality of electronic components arranged on the main surface 90a via, for example, the via conductors formed in the module laminate 90. According to an exemplary aspect, copper electrodes can be used for the plurality of land electrodes 150. However, the plurality of land electrodes 150 are not limited to these materials. For example, as the plurality of land electrodes, solder electrodes are used in some exemplary embodiments. Instead of the plurality of land electrodes 150, a plurality of bump electrodes or a plurality of post electrodes are used as a plurality of external connection terminals in some exemplary embodiments.

The resin member 91 covers the main surface 90a and at least part of the plurality of electronic components on the main surface 90a. The resin member 91 has the function of ensuring reliability such as mechanical strength and moisture resistance of the plurality of electronic components on the main surface 90a. Note that the resin member 91 does not have to be included in the tracker module 100.

Note that the configuration of the tracker module 100 according to the present example is an example and is not limited to this. For example, part of the capacitors and inductors arranged on the main surface 90a are formed in the module laminate 90 in some exemplary embodiments. Moreover, part of the capacitors and inductors arranged on the main surface 90a does not have to be included in the tracker module 100 or arranged in or on the module laminate 90.

[4 Connection and Position Relationship Between Bump Electrodes]

In the following, the plurality of bump electrodes 81 of the integrated circuit 80 and two bump electrodes 821 and 822 of the capacitor C11 will be described with reference to FIGS. 7 and 8.

Figure 7:
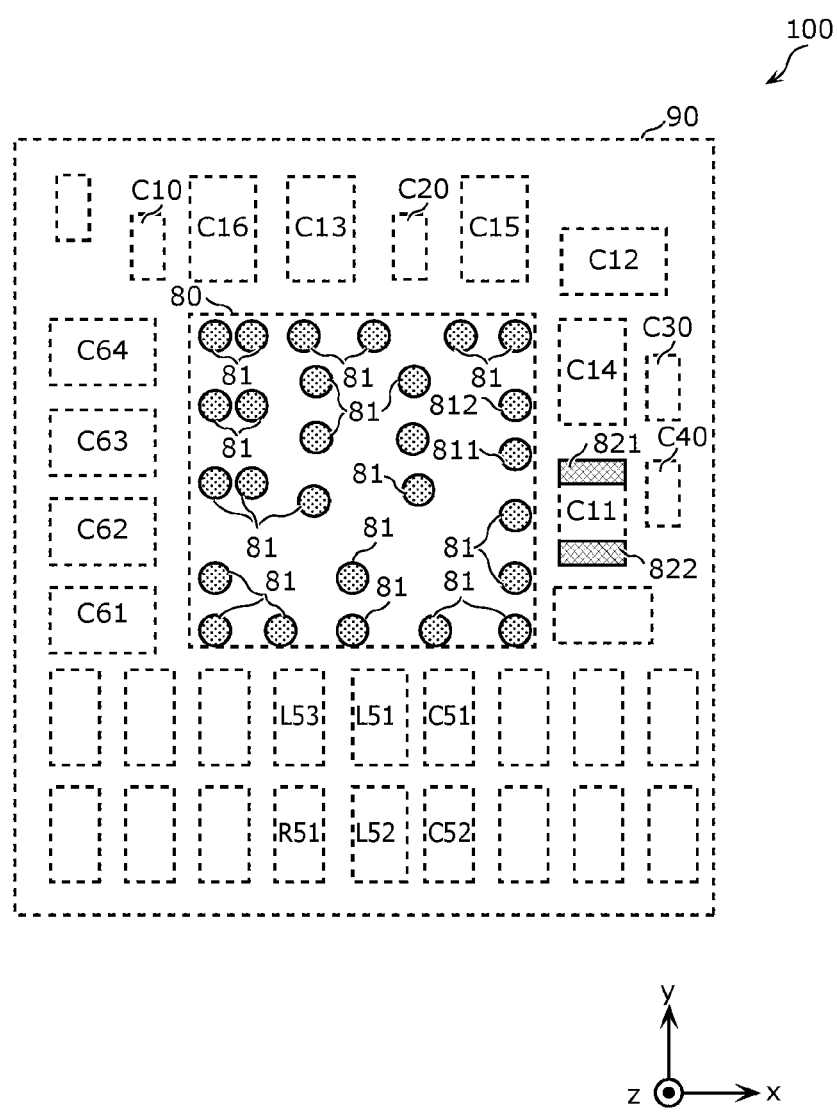
FIG. 7 is a plan view of electrodes of an integrated circuit and a capacitor included in the tracker module according to some exemplary embodiments.

FIG. 7 is a plan view of the bump electrodes 81, 821, and 822 of the integrated circuit 80 and capacitor C11 included in the tracker module 100 according to the present example. FIG. 8 is an enlarged plan view of bump electrodes 811 and 812 of the integrated circuit 80 and the bump electrodes 821 and 822 of the capacitor C11 included in the tracker module 100 according to the present example.

As illustrated in FIG. 7, the plurality of bump electrodes 81 include the bump electrodes 811 and 812. The capacitor C11 includes the bump electrodes 821 and 822.

The bump electrode 811 is an example of a third terminal and is electrically connected to the bump electrode 821 of the capacitor C11 outside the integrated circuit 80. The bump electrode 811 is electrically connected to the one end of the switch S11 and the one end of the switch S12 inside the integrated circuit 80.

The bump electrode 812 is an example of a fourth terminal and is electrically connected to the bump electrode 822 of the capacitor C11 outside the integrated circuit 80. The bump electrode 812 is electrically connected to the one end of the switch S21 and the one end of the switch S22 inside the integrated circuit 80.

Note that as illustrated in FIG. 7, the bump electrode 811 is arranged closer to the capacitor C11 than the bump electrode 812 is.

The bump electrode 821 is an example of a first terminal, and a first electric potential (specifically, V4 or V3) is applied to the bump electrode 821. The bump electrode 821 is electrically connected to one of the two electrodes inside the capacitor C11 and is electrically connected to the bump electrode 811 of the integrated circuit 80 outside the capacitor C11.

The bump electrode 822 is an example of a second terminal, and a second electric potential (specifically, V3 or V2) lower than the first electric potential is applied to the bump electrode 822. The bump electrode 822 is electrically connected to the other one of the two electrodes inside the capacitor C11 and is electrically connected to the bump electrode 812 of the integrated circuit 80 outside the capacitor C11.

Figure 8:
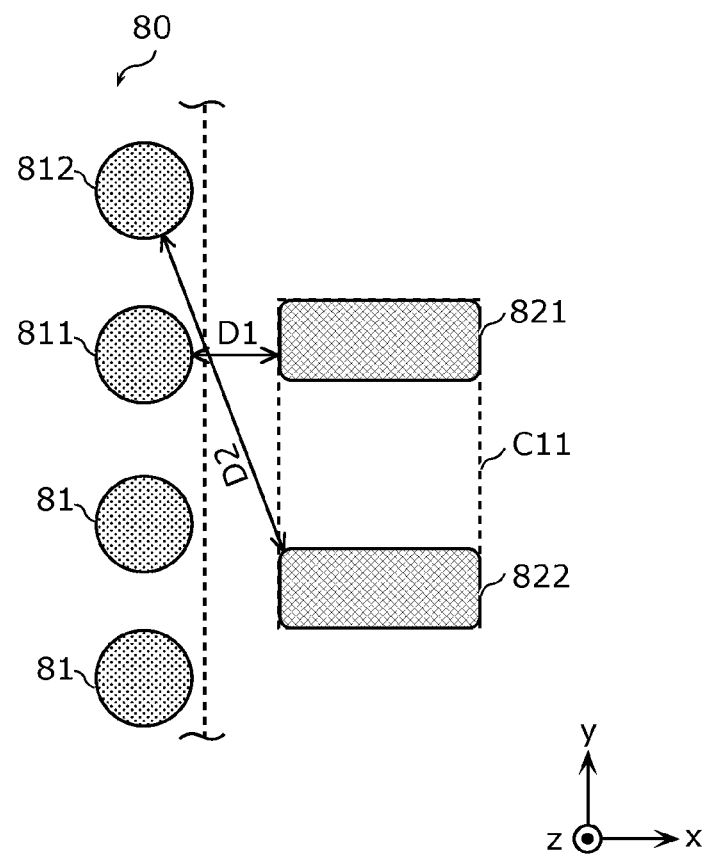
FIG. 8 is an enlarged plan view of electrodes of the integrated circuit and the capacitor included in the tracker module according to some exemplary embodiments.

As illustrated in FIG. 8, a distance D1 (an example of a first distance) between the bump electrodes 811 and 821 is shorter than a distance D2 (an example of a second distance) between the bump electrodes 812 and 822.

[5 Effects]

As described above, the tracker module 100 according to the present example includes the module laminate 90, the integrated circuit 80 arranged in or on the module laminate 90, and the capacitors C11 and C30 arranged in or on the module laminate 90, and the integrated circuit 80 includes at least one switch included in the switched-capacitor circuit 20 and at least one switch included in the supply modulator 30. The switched-capacitor circuit 20 is configured to generate a plurality of discrete voltages on the basis of the input voltage, and the supply modulator 30 is configured to output at least one out of the plurality of discrete voltages in a selective manner on the basis of the envelope signal. The capacitor C11 is a first flying capacitor included in the switched-capacitor circuit 20. The capacitor C30 is a smoothing capacitor included in the switched-capacitor circuit 20. In a plan view of the module laminate 90, the capacitor C11 is arranged closer to the integrated circuit 80 than the capacitor C30 is.

In other words, the tracker module 100 according to the present example includes the module laminate 90, the integrated circuit 80 arranged in or on the module laminate 90, and the capacitors C11 and C30 arranged in or on the module laminate 90, and the integrated circuit 80 includes at least one switch included in the switched-capacitor circuit 20 and at least one switch included in the supply modulator 30 having the control terminals 135 and 136 connected to the RFIC 5. The switched-capacitor circuit 20 is configured to generate a plurality of discrete voltages on the basis of the input voltage, and the supply modulator 30 is configured to output, in a selective manner, at least one out of the plurality of discrete voltages. The capacitor C11 is a first flying capacitor included in the switched-capacitor circuit 20. The capacitor C30 is a smoothing capacitor included in the switched-capacitor circuit 20. In a plan view of the module laminate 90, the capacitor C11 is arranged closer to the integrated circuit 80 than the capacitor C30 is.

According to this configuration, the capacitor C11, which functions as a flying capacitor in the switched-capacitor circuit 20, is arranged closer to the integrated circuit 80 than the capacitor C30 is, which functions as a smoothing capacitor in the switched-capacitor circuit 20. That is, the distance between the flying capacitor and the integrated circuit 80 is shorter than the distance between the smoothing capacitor and the integrated circuit 80. The minimum length of a wiring line connecting two components is limited by the distance between the two components. Furthermore, a higher current than that supplied to the smoothing capacitor that smooths energy to be supplied to the load at the time of switch switching is input to and output from the flying capacitor that supplies energy and electric charge to the load and the smoothing capacitor by repeating charge and discharge. Therefore, by arranging the capacitor C11 closer to the integrated circuit 80 than the capacitor C30, the length of the wiring line between the capacitor C11 and the integrated circuit 80 through which a relatively high current flows can be made shorter than the length of the wiring line between the capacitor C30 and the integrated circuit 80 through which only a relatively low current flows. That is, the wiring line through which a higher current flows can be made shorter, so that the resistance loss in wiring can be reduced.

In another aspect, the tracker module 100 according to the present example includes the module laminate 90, the integrated circuit 80 arranged in or on the module laminate 90, and the capacitors C11, C30, and C14 arranged in or on the module laminate. The integrated circuit 80 includes at least one switch included in the switched-capacitor circuit 20 and at least one switch included in the supply modulator 30. The switched-capacitor circuit 20 includes the capacitor C11, the capacitor C30, and the capacitor C14. The capacitor C11 has a first electrode and a second electrode, and the capacitor C14 has a third electrode and a fourth electrode. The at least one switch included in the switched-capacitor circuit 20 includes the switches S11 to S14 and S21 to S24. The one end of the switch S11 and the one end of the switch S12 are connected to the first electrode. The one end of the switch S22 and the one end of the switch S21 are connected to the second electrode. The one end of the switch S13 and the one end of the switch S14 are connected to the third electrode. The one end of the switch S24 and the one end of the switch S23 are connected to the fourth electrode. The other end of the switch S11, the other end of the switch S22, the other end of the switch S13, and the other end of the switch S24 are connected to the capacitor C30. The other end of the switch S12 is connected to the other end switch S14. The other end of the switch S21 is connected to the other end of the switch S23. The supply modulator 30 includes the output terminal 130. The at least one switch included in the supply modulator 30 includes the switch S52 connected between the other ends of the switches S11, S22, S13, and S24 and the output terminal 130, and the switch S51 connected between the other ends of the switches S12 and S14 and the output terminal 130. In a plan view of the module laminate, the capacitor C11 is arranged closer to the integrated circuit 80 than the capacitor C30 is.

According to this configuration, the capacitor C11, which functions as a flying capacitor in the switched-capacitor circuit 20, is arranged closer to the integrated circuit 80 than the capacitor C30 is, which functions as a smoothing capacitor in the switched-capacitor circuit 20. That is, the distance between the flying capacitor and the integrated circuit 80 is shorter than the distance between the smoothing capacitor and the integrated circuit 80. The minimum length of a wiring line connecting two components is limited by the distance between the two components. Furthermore, a higher current than that supplied to the smoothing capacitor that smooths energy to be supplied to the load at the time of switch switching is input to and output from the flying capacitor that supplies energy and electric charge to the load and the smoothing capacitor by repeating charge and discharge. Therefore, by arranging the capacitor C11 closer to the integrated circuit 80 than the capacitor C30, the length of the wiring line between the capacitor C11 and the integrated circuit 80 through which a relatively high current flows can be made shorter than the length of the wiring line between the capacitor C30 and the integrated circuit 80 through which only a relatively low current flows. That is, the wiring line through which a higher current flows can be made shorter, so that the resistance loss in wiring can be reduced. In particular, the switched-capacitor circuit 20 includes the two flying capacitors (the capacitors C11 and C14) that operate complementarily, and thus it is sufficient that the smoothing capacitor (the capacitor C30) can supply energy to the load at the time of switch switching between the two flying capacitors. Thus, the effect of reducing resistance loss by making the length of the wiring line between the capacitor C11 and the integrated circuit 80 shorter than the length of the wiring line between the capacitor C30 and the integrated circuit 80 is high.

Moreover, for example, in the tracker module 100 according to the present example, the capacitor C11 is larger in size than the capacitor C30 in a plan view of the module laminate 90 in some exemplary embodiments.

According to this configuration, even when it is difficult to make the capacitor C11 sufficiently higher than the capacitor C30 due to, for example, the low profile of the tracker module 100, the capacitor C11 can be made larger in volume than the capacitor C30, and the electrostatic capacitance of the capacitor C11 functioning as a flying capacitor can be made higher than that of the capacitor C30 functioning as a smoothing capacitor.

Moreover, for example, the tracker module 100 according to the present example may further include the capacitor C12 arranged in or on the module laminate 90. The capacitor C12 is a second flying capacitor that is included in the switched-capacitor circuit 20 and to which a lower electric potential is applied than to the first flying capacitor. In a plan view of the module laminate 90, in some exemplary embodiments, the capacitor C11 is arranged closer to the integrated circuit 80 than the capacitor C12 is.

According to this configuration, since the capacitor C11 is arranged closer to the integrated circuit 80 than the capacitor C12 is, the wiring line between the capacitor C11 and the integrated circuit 80 can be made shorter than the wiring line between the capacitor C12 and the integrated circuit 80. A higher current flows through the wiring line between the capacitor C11 and the integrated circuit 80 where a higher electric potential is applied, and thus the resistance loss in wiring is effectively reduced.

For example, in the tracker module 100 according to the present example, the capacitor C11 can include the bump electrode 821, to which a first electric potential (V4) is applied, and the bump electrode 822, to which a second electric potential (V3) lower than the first electric potential (V4) is applied. The integrated circuit 80 can include the bump electrode 811 and the bump electrode 812, the bump electrode 811 being electrically connected to the bump electrode 821, the bump electrode 812 being electrically connected to the bump electrode 822. In a plan view of the module laminate 90, in some exemplary embodiments, the bump electrode 811 is arranged closer to the capacitor C11 than the bump electrode 812 is.

According to this configuration, since the bump electrode 811 is arranged closer to the capacitor C11 than the bump electrode 812 is, the distance between the bump electrode 811 and the capacitor C11 can be shorter than the distance between the bump electrode 812 and the capacitor C11. A higher current flows through the wiring line between the bump electrode 811 and the capacitor C11 where a higher electric potential is applied, and thus the resistance loss in wiring is effectively reduced.

Moreover, for example, in the tracker module 100 according to the present example, in a plan view of the module laminate 90, the distance D1 between the bump electrodes 821 and 811 is shorter than the distance D2 between the bump electrodes 822 and 812, in some exemplary embodiments.

According to this configuration, since the distance D1 between the bump electrodes 821 and 811 where a higher electric potential is applied is shorter than the distance D2 between the bump electrodes 822 and 812 where a lower electric potential is applied, the wiring line through which a higher current flows can be shortened, and thus the resistance loss in wiring is effectively reduced.

Moreover, for example, in the tracker module 100 according to the present example, the integrated circuit 80 can include the SC switch portion 80b and the OS switch portion 80c, the SC switch portion 80b including the at least one switch included in the switched-capacitor circuit 20, the OS switch portion 80c including the at least one switch included in the supply modulator 30. The SC switch portion 80b is arranged closer to the capacitor C11 than the OS switch portion 80c is, in some exemplary embodiments.

According to this configuration, the wiring line between the capacitor C11 and the SC switch portion 80b can be shortened, and thus the resistance loss in wiring is effectively reduced.

Moreover, for example, in the tracker module 100 according to the present example, the SC switch portion 80b is arranged closer to the capacitor C30 than the OS switch portion 80c is, in some exemplary embodiments.

According to this configuration, the wiring line between the capacitor C30 and the SC switch portion 80b can be shortened, and thus the resistance loss in wiring is effectively reduced.

Moreover, for example, in the tracker module 100 according to the present example, the integrated circuit 80 is a single integrated circuit in some exemplary embodiments.

According to this configuration, the switches included in the switched-capacitor circuit 20 and the supply modulator 30 can be integrated in the integrated circuit 80, which is a single integrated circuit, thereby contributing to the miniaturization of the tracker module 100.

ADDITIONAL EXEMPLARY EMBODIMENTS

The tracker modules according to the present disclosure have been described above on the basis of the embodiment and example. However, the tracker modules according to the present disclosure is not limited to the above-described embodiment and example. The present disclosure also includes other suitable embodiments and examples realized by combining any constituent elements of the above-described embodiments and examples, variations obtained by applying various transformations to the above-described embodiment and example that are conceivable by those skilled in the art to the extent not departing from the scope of the present disclosure, and various devices incorporating the above-described tracker modules.

For example, in the circuit configuration of the various circuits according to the above-described embodiment, another circuit element, another wiring line, and so forth are inserted partway along the paths connecting each circuit element and each signal path disclosed in the drawings according to an exemplary aspect. For example, in some exemplary embodiments, an impedance matching circuit is inserted between the power amplifier 2 and the filter 3, or between the filter 3 and the antenna 6, or both between the power amplifier 2 and the filter 3 and between the filter 3 and the antenna 6.

As a tracker module that supplies a power supply voltage to a power amplifier, the present disclosure can be widely used for communication devices such as mobile phones.

REFERENCE SIGNS LIST 1 power supply circuit
2 power amplifier
3 filter
4 PA control circuit
5 RFIC
6 antenna
7 communication device
10 pre-regulator circuit
20 switched-capacitor circuit
30 supply modulator
40 filter circuit
50 direct current (DC) power source
80 integrated circuit
80a PR switch portion
80b SC switch portion
80c OS switch portion
81, 811, 812, 821, 822 bump electrode
90 module laminate
90a, 90b main surface
91 resin member
100 tracker module
110, 131, 132, 133, 134, 140 input terminal
111, 112, 113, 114, 130, 141 output terminal
115, 116 inductor connection terminal
117, 120, 135, 136 control terminal
150 land electrode
C10, C11, C12, C13, C14, C15, C16, C20, C30, C40, C51, C52, C61, C62, C63, C64 capacitor
D1, D2 distance
L51, L52, L53 inductor
L71 power inductor
N1, N2, N3, N4 node
R51 resistor
S11, S12, S13, S14, S21, S22, S23, S24, S31, S32, S33, S34, S41, S42, S43, S44, S51, S52, S53, S54, S61, S62, S63, S71, S72 switch
V1, V2, V3, V4 voltage

The invention claimed is:

1. A tracker module comprising:
a module laminate;
at least one integrated circuit arranged in or on the module laminate; and
a first capacitor and a second capacitor arranged in or on the module laminate,
wherein:
the at least one integrated circuit includes:
at least one switch in a switched-capacitor circuit that is configured to generate a plurality of discrete voltages; and
at least one switch in a supply modulator that is configured to generate an output voltage by selectively switching among the plurality of discrete voltages based on a control signal;
the first capacitor is a first flying capacitor of the switched-capacitor circuit;
the second capacitor is a smoothing capacitor of the switched-capacitor circuit; and
in a plan view of the module laminate, the first capacitor is arranged closer to the at least one integrated circuit than the second capacitor.

2. The tracker module according to claim 1, wherein the control signal is generated based on an envelope signal associated with a signal to be processed by a circuit that is powered based on the output voltage.

3. The tracker module according to claim 1, wherein the supply modulator includes a control terminal that is configured to receive the control signal from a control circuit.

4. The tracker module according to claim 1, wherein, in the plan view of the module laminate, the first capacitor is larger in size than the second capacitor.

5. The tracker module according to claim 1, further comprising:
a third capacitor arranged in or on the module laminate, wherein:
the third capacitor is a second flying capacitor of the switched-capacitor circuit and a lower electric potential is applied to the second flying capacitor than to the first flying capacitor; and
in the plan view of the module laminate, the first capacitor is arranged closer to the at least one integrated circuit than the third capacitor.

6. The tracker module according to claim 1, wherein:
the first capacitor includes:
a first terminal that is applied with a first electric potential, and
a second terminal that is applied with a second electric potential lower than the first electric potential;
the at least one integrated circuit includes:
a third terminal that is electrically connected to the first terminal, and
a fourth terminal that is electrically connected to the second terminal; and
in the plan view of the module laminate, the third terminal is arranged closer to the first capacitor than the fourth terminal.

7. The tracker module according to claim 6, wherein, in the plan view of the module laminate, a first distance between the first terminal and the third terminal is shorter than a second distance between the second terminal and the fourth terminal.

8. The tracker module according to claim 1, wherein:
the at least one integrated circuit includes:
    first one or more switches that are a portion of the switched-capacitor circuit, and
    second one or more switches that are a portion of the supply modulator; and
the first one or more switches are arranged closer to the first capacitor than the second one or more switches.

9. The tracker module according to claim 8, wherein the first one or more switches are arranged closer to the second capacitor than the second one or more switches.

10. The tracker module according to claim 1, wherein the at least one integrated circuit is a single integrated circuit.

11. A tracker module comprising:
a module laminate;
at least one integrated circuit arranged in or on the module laminate; and
a first capacitor, a second capacitor, and a third capacitor arranged in or on the module laminate,
wherein:
    the at least one integrated circuit includes:
        a first plurality of switches in a switched-capacitor circuit, and
        a second plurality of switches in a supply modulator;
    the switched-capacitor circuit includes:
        the first capacitor having a first electrode and a second electrode,
        the second capacitor, and
        the third capacitor having a third electrode and a fourth electrode;
    the first plurality of switches in the switched-capacitor circuit includes:
        a first switch, a second switch, a third switch, a fourth switch, a fifth switch, a sixth switch, a seventh switch, and an eighth switch;
    a first end of the first switch and a first end of the third switch are connected to the first electrode;
    a first end of the second switch and a first end of the fourth switch are connected to the second electrode;
    a first end of the fifth switch and a first end of the seventh switch are connected to the third electrode;
    a first end of the sixth switch and a first end of the eighth switch are connected to the fourth electrode;
    a second end of the first switch, a second end of the second switch, a second end of the fifth switch, and a second end of the sixth switch are connected to the second capacitor;
    a second end of the third switch is connected to a second end of the seventh switch;
    a second end of the fourth switch is connected to a second end of the eighth switch;
    the supply modulator includes an output terminal;
    the second plurality of switches in the supply modulator includes:
        a ninth switch connected between the output terminal and each of the second end of the first switch, the second end of the second switch, the second end of the fifth switch, and the second end of the sixth switch; and
        a tenth switch connected between the output terminal and each of the second end of the third switch and the second end of the seventh switch, and in a plan view of the module laminate, the first capacitor is arranged closer to the at least one integrated circuit than the second capacitor.

12. The tracker module according to claim 11, wherein in the plan view of the module laminate, the first capacitor is larger in size than the second capacitor.

13. The tracker module according to claim 11, further comprising:
a fourth capacitor arranged in or on the module laminate,
wherein the switched-capacitor circuit further includes:
    the fourth capacitor having a fifth electrode and a sixth electrode; and
    a fifth capacitor having a seventh electrode and an eighth electrode,
wherein the first plurality of switches in the switched-capacitor circuit further includes an eleventh switch, a twelfth switch, a thirteenth switch, and a fourteenth switch;
wherein the first end of the second switch and the first end of the fourth switch are further connected to the fifth electrode,
a first end of the eleventh switch and a first end of the twelfth switch are connected to the sixth electrode,
wherein the first end of the sixth switch and the first end of the eighth switch are further connected to the seventh electrode,
wherein a first end of the thirteenth switch and a first end of the fourteenth switch are connected to the eighth electrode;
wherein the second end of the fourth switch, the second end of the eighth switch, a second end of the eleventh switch, and a second end of the thirteenth switch are connected to each other;
wherein a second end of the twelfth switch is connected to a second end of the fourteenth switch, and
wherein, in the plan view of the module laminate, the first capacitor is arranged closer to the at least one integrated circuit than the fourth capacitor.

14. The tracker module according to claim 11, wherein:
the first capacitor includes:
    a first terminal that is electrically connected to the first electrode, the first electrode being applied with a first electric potential; and
    a second terminal that is electrically connected to the second electrode, the second electrode being applied a second electric potential that is lower than the first electric potential,
the at least one integrated circuit includes:
    a third terminal that is electrically connected to the first terminal; and
    a fourth terminal that is electrically connected to the second terminal, and in the plan view of the module laminate, the third terminal is arranged closer to the first capacitor than the fourth terminal.

15. The tracker module according to claim 14, wherein, in the plan view of the module laminate, a first distance between the first terminal and the third terminal is shorter than a second distance between the second terminal and the fourth terminal.

16. The tracker module according to claim 11, wherein the first plurality of switches are arranged closer to the first capacitor than the second plurality of switches.

17. The tracker module according to claim 16, wherein the first plurality of switches are arranged closer to the second capacitor than the second plurality of switches.

18. The tracker module according to claim 11, wherein the at least one integrated circuit is a single integrated circuit.

19. A method performed by a tracker module, the method comprising:

generating a plurality of discrete voltages by a switched-capacitor circuit of the tracker module; and generating, from a supply modulator of the tracker module, an output voltage by selectively switching among the plurality of discrete voltages based on a control signal;

wherein:
- the tracker module includes:
    - at least one integrated circuit arranged in or on a module laminate of the tracker module; and
    - a first capacitor and a second capacitor arranged in or on the module laminate,
- the first capacitor being a first flying capacitor of the switched-capacitor circuit;
- the second capacitor being a smoothing capacitor of the switched-capacitor circuit; and
- in a plan view of the module laminate, the first capacitor is arranged closer to the at least one integrated circuit than the second capacitor.

20. The method according to claim 19, further comprising generating the control signal based on an envelope signal that is associated with a signal to be processed by a circuit that is powered based on the output voltage.

* * * * *